United States Patent [19]

Miller, Jr. et al.

[11] Patent Number: 5,326,986
[45] Date of Patent: Jul. 5, 1994

[54] PARALLEL N-JUNCTION SUPERCONDUCTING INTERFEROMETER WITH ENHANCED FLUX-TO-VOLTAGE TRANSFER FUNCTION

[75] Inventors: John H. Miller, Jr.; Terry D. Golding; Jaiming Huang, all of Houston, Tex.

[73] Assignee: University of Houston - University Park, Houston, Tex.

[21] Appl. No.: 932,622

[22] Filed: Aug. 20, 1992

Related U.S. Application Data

[63] Continuation-in-part of Ser. No. 665,026, Mar. 5, 1991, abandoned.

[51] Int. Cl.$^5$ .................... H01L 45/00; H03K 17/92; G01R 33/02; H01B 12/00
[52] U.S. Cl. .................................... 505/162; 257/36; 257/39; 257/661; 257/662; 257/663; 257/31; 307/245; 307/277; 307/306; 324/248; 505/702; 505/846; 505/861
[58] Field of Search ..................... 257/31-39, 257/661-663; 307/245, 277, 306; 324/248; 505/1, 702, 846, 861

[56] References Cited

U.S. PATENT DOCUMENTS

| | | |
|---|---|---|
| 3,978,351 | 8/1976 | Zappe . |
| 3,987,309 | 10/1976 | Hamel et al. . |
| 4,117,354 | 9/1978 | Geewala . |
| 4,490,733 | 12/1984 | Kroger . |
| 4,491,795 | 1/1985 | Gelinas . |
| 4,585,999 | 4/1986 | Hilbert et al. . |
| 4,660,061 | 4/1987 | Sweeny et al. . |
| 4,710,651 | 12/1987 | Suzuki . |
| 4,713,562 | 12/1987 | Hasuo et al. . |
| 4,837,609 | 6/1989 | Gurvitch et al. . |
| 4,977,896 | 12/1990 | Robinson et al. ............... 128/653 R |
| 4,982,157 | 1/1991 | Seifert .................. 324/248 |
| 4,982,158 | 1/1991 | Nakata et al. ........... 505/1 |
| 5,004,724 | 4/1991 | De ......................... 505/702 |
| 5,011,820 | 4/1991 | Ehrhart et al. ......... 505/1 |

OTHER PUBLICATIONS

Doss, *Engineers Guide to High Temp. Superconductivity*, J. Wiley & Sons © 1989, Chapter 4, pp. 150-159.
Koch, et al., *Thin Films and SQUIDS made from YBa-CuO*, presented at MRS Conf. Apr. 1987, pp. 81-84.
Ito, et al., *Highly Sensitive Photodetection using a microwave-coupled BaPbBiO Josephson junction array*, Appl. Phys. Lett., vol. 43(3), Aug. 1983, pp. 314-316.
Yoshimori, et al., *Millimeter-Wave Responses of a Micro-Contact Josephson Junction Using a New Structure*, IEEE Trans. Electron Dev., vol. ED-33, No. 7, Jul. 1986.
Steuhm, et al., *Three-Josephson-Junction Interferometer*, Appl. Phys. Lett., vol. 20, No. 11, Jun. 1, 1972, pp. 456-458.
Benz, et al., *Fractional Giant Shapiro Steps and Spatially Correlated Motion in 2D Josephson Arrays*, Phys. Rev. Lett., vol. 64, No. 6, Feb. 5, 1990, pp. 693-696.
Benz, et al., *Critical Currents in Frustrated Two-Dimensional Josephson Arrays*, Phys. Rev. B, vol. 42, No. 10, Oct. 1, 1990, pp. 6165-6171.
Rzchowski, et al., *Vortex Pinning in Josephson-Junction Arrays*, Am. Phys. Soc., 1990, pp. 2041-2050.

(List continued on next page.)

Primary Examiner—Edward Wojciechowicz
Attorney, Agent, or Firm—Pravel, Hewitt, Kimball & Krieger

[57] ABSTRACT

A physical configuration for a parallel multi-junction superconducting quantum interference device that can be used for a variety of applications involving the detection of magnetic flux, including applications where it is desired to measure the absolute magnitude of the flux. The device of this invention features a novel geometry for a multi-junction interference device which significantly enhances the flux-to-voltage transfer function, thereby yielding a significant improvement in the device sensitivity in its use in a magnetometer, gradiometer, or other applications.

12 Claims, 6 Drawing Sheets

OTHER PUBLICATIONS

Clarke, *Superconducting Devices*, edited by S. T. Ruggiero & David T. Rudman, Academic Press, 1990, ch. 2, pp. 51–99.

Lukens, *Superconducting Devices*, edited by Stephen T. Ruggiero and David T. Rudman, Academic Press, 1990, Ch. 4, pp. 135, 142–145, 164–167.

Simon, et al., *High-$T_c$ Thin Films and Electronic Devices*, Physics Today, Jun. 1991, pp. 64–70.

Feynman, et al., *The Feynman Lectures on Physics-Quantum Mechanics*, Addison Wesley Publishing Co., 1965, p. 21–18.

Zimmerman and Silver, *Macroscopic Quantum Interference Effects Through Superconducting Point Contacts*, Physical Review, vol. 141, No. 1, Jan. 1966, pp. 367–375.

Waele, et al., *A Superconducting Interference Grating*, Physica, vol. 40, 1968, pp. 302–308.

Huang, J., et al., *Enhanced Quantum Interference Effects in Normal and Superconducting Arrays*, presented at International Symposium on Nanostructures and Mesoscopic Systems, Santa Fe, New Mixico, May 19–24, 1991; Superlattices and Microstructures 11, 159–161 (1992).

Clark, *SQUIDs: Principles, Noise, and Applications*, Dept. of Physics, University of California and Materials and Chemical Sciences Division, Lawrence Berkeley Laboratory, Berkeley, Calif. 1990, Academic Press, Inc.

Miller, J. H., Jr., et al., *Enhanced Quantum Interference effects in parallel Josephson Junction Arrays*, Appl. Phys. Lett. 59(26), Dec. 16, 1991, pp. 3330–3332.

PARALLEL N-JUNCTION SUPERCONDUCTING INTERFEROMETER WITH ENHANCED FLUX-TO-VOLTAGE TRANSFER FUNCTION

This is a continuation-in-part of copending application Ser. No. 07/665,026, filed on Mar. 5, 1991, now abandoned.

BACKGROUND OF THE INVENTION

1. Field Of the Invention

This invention relates to a parallel multi-junction Superconducting QUantum Interference Device (SQUID), or a Superconducting QUantum Interference Grating (SQUIG), that can be used for a variety of applications involving the detecting of magnetic flux, including applications where it is desired to measure the absolute magnitude of the magnetic field. More specifically, the device of this invention features a novel geometry for a SQUIG which significantly enhances the flux-to-voltage transfer function to yield an improvement in the device sensitivity in its use as a magnetometer, a gradiometer, and in other applications.

2. Description of Relevant Art

In order to understand this invention, it is first necessary to understand the conventional SQUID. A SQUID (Superconducting QUantum Interference Device) is the most sensitive detector of magnetic flux currently available.

SQUIDs combine the two physical phenomena of flux quantization (the fact that the flux $\Phi$ in a closed superconducting loop is quantized in units of $\Phi_0$), and Josephson tunneling, or coupling.

A SQUID is, in essence, a flux-to-voltage transducer, providing an output voltage that is related to and is periodic in the applied flux. The period is one flux quantum, or:

$$\Phi_0 = h/2e \approx 2.07 \times 10^{-15} Wb$$

It is typically possible to detect an output signal corresponding to a flux change of much less than $\Phi_0$.

A SQUID is extremely versatile, being able to measure any physical quantity which can be converted into a flux. For example, magnetic field, magnetic field gradient, current, voltage, displacement, and magnetic susceptibility can all be measured using a SQUID. As a result of this versatility, the SQUID has been used in a wide variety of applications, ranging from the detection of tiny magnetic fields produced by the human brain and the measurement of fluctuating magnetic fields in remote areas, to the detection of gravity waves and the observation of spin noise in an ensemble of magnetic nuclei.

There are two basic types of SQUIDs. See, for example, Clark, in *Superconducting Devices*, edited by Steven T. Ruggiero and David T. Rudman, Academic Press, 1990, ch. 2, pp. 51-99, for a detailed review of SQUIDs. The dc SQUID consists of two Josephson junctions connected in parallel on a superconducting loop. The dc SQUID is so named because it typically operates with a steady current bias. The other type of SQUID, the rf SQUID, involves a single Josephson junction interrupting the current flow around a superconducting loop and is typically operated with a radio frequency (rf) flux bias.

This invention relates to the geometric parallel of a multi-junction dc SQUID, or a SQUIG (Superconducting QUantum Interference Grating). In order to better teach the invention and to explain its principles of operation, it is necessary to describe SQUIDs in general and dc SQUIDs in particular. It is further necessary to describe the operation, advantages, and drawbacks of a SQUIG.

A number of different types of Josephson junctions, or weak links, have been demonstrated. These include superconductor-insulator-superconductor (SIS)junctions, superconductor-normal metal-superconductor (SNS) junctions, superconductor-semiconductor-superconductor (S-Sm-S) junctions, microbridges, ion irradiated links, and grain boundary junctions. One skilled in the art would appreciate that the superconducting regions used in each type of Josephson junction may be of the same type or may be of different types. For example, one could have a Nb-I-Nb junction or a Nb-I-Pb junction. See Likharev, *Rev. Mod. Phys.*, Vol. 51, p. 101 (1979).

The dc SQUID consists of two shunted Josephson junctions interrupting a superconducting ring as shown in FIG. 1a. Each junction, represented by crosses, , may have a capacitance C ranging from zero to several picofarads, and each junction is shunted by a resistance R. The junctions are resistively shunted to eliminate hysteresis in the current-voltage (I-V) characteristic, which is shown for an unshunted junction in FIG. 1b for $\Phi$ equal to $n\Phi_0$ and $\Phi$ equal to $(n+\frac{1}{2})\Phi_0$, where $\Phi$ is the external flux applied to the loop and "n" is an integer. The constant bias current, $I_B$, (greater than two times the critical current, or $2I_0$) maintains a non-zero voltage across the SQUID, which has a non-hysteretic current-voltage characteristic. If the magnetic flux, $\Phi$, threading the SQUID ring is slowly varied, the critical current will oscillate as a function of $\Phi$ with a period that is just $\Phi_0$. The critical current is a maximum for $\Phi = n\Phi_0$, and a minimum for $\Phi = (n+\frac{1}{2})\Phi_0$.

The effect of the magnetic field is to change the phase difference between the two junctions. The oscillating behavior arises from interference between the wave functions at the two junctions in a manner analogous to interference in optics—hence the term "Interference Device." At low voltages, the current-voltage characteristic is also modulated because the current contains a contribution from the time averaged ac supercurrent. As a result, when the SQUID is biased with a constant current, the voltage is periodic in $\Phi$ with period $\Phi_0$, as shown in FIG. 1c.

Modern dc SQUIDs are invariably made from thin films, with the aid of either photolithography or electron beam lithography. In most, although not all, practical applications, the SQUID is used in a feedback circuit as a null-detector of magnetic flux. A small modulating flux is applied to the SQUID with a frequency usually between 100 and 500 kHz, as indicated in FIG. 2. If the quasistatic flux in the SQUID is exactly $n\Phi_0$, the resulting voltage across the SQUID is a rectified version of the input signal, that is, it contains only the second harmonic of the reference frequency, as indicated in FIG. 2a. If this voltage is sent through a lock-in detector referenced to the fundamental frequency, the output will be zero. On the other hand, if the quasistatic flux is $(n+\frac{1}{4})\Phi_0$, the voltage across the SQUID is at the fundamental frequency, as shown in FIG. 2b, and the output from the lock-in detector will be a maximum. Thus, as one increases the flux from $n\Phi_0$ to $(n+\frac{1}{4})\Phi_0$, the output from the lock-in detector will increase steadily; if one reduces the flux from $n\Phi_0$ to $(n-\frac{1}{4})\Phi_0$, the output will increase in the negative direction, as indicated in FIG. 2c.

A typical modulation and feedback circuit for a dc SQUID is shown in FIG. 3. This circuit is essentially a flux-locked loop. The alternating voltage across the SQUID is coupled to a low-noise preamplifier, usually at room temperature, via either a cooled transformer or a cooled LC series-resonant circuit. An oscillator applies a modulating flux to the SQUID via a feedback and modulation coil. The geometry, dimensions, efficiency, and actual construction of the feedback coil are not critical; the feedback coil's magnetic field should simply be isolated from the pickup loop or gradiometer winding and be uniform over the loop created by the SQUID. After amplification, the signal from the SQUID is lock-in detected and sent through the integrating circuit. The smoothed output is connected to the modulation and feedback coil via a large series resistor $R_f$. Thus, if one applies a flux $\delta\Phi$ to the SQUID via the input coil (or otherwise), the feedback circuit will generate an opposing flux of $-\delta\Phi$, and a voltage proportional to $\delta\Phi$ appears across $R_f$. This technique enables one to measure changes in flux ranging from much less than a single flux quantum to many flux quanta.

Applications of the SQUID. One of the simplest instruments using a SQUID is the magnetometer. A pickup loop is connected across the input coil (as shown in FIG. 3), which couples the flux into the SQUID, to make a superconducting flux transformer, as shown in FIG. 4a. The SQUID and input coil are generally enclosed in a superconducting shield. The pickup loop and flux transformer function as a magnetic "antenna," or magnetic "hearing aid," where the flux passing through the pickup loop is coupled into the much smaller loop of the SQUID. An important requirement for optimum sensitivity is that the inductance of the pickup loop should be about equal to the inductance of the much smaller input coil, which typically has between ten and one hundred turns. Since the size of the SQUID is restricted by other considerations, such as the increase of noise with SQUID loop area, this requirement imposes constraints on the maximum size of the pickup loop and, therefore, the overall sensitivity of the magnetometer. Magnetometers have usually involved flux transformers made of Nb wire. Magnetometers with typical sensitivities of 0.01 pT $Hz^{-\frac{1}{2}}$ have been used in geophysics in a variety of applications, such as magnetotellurics, active electromagnetic sounding, piezomagnetism, tectonomagnetism, and the location of hydrofractures.

An important variation of the magnetometer is the gradiometer. The pickup and input coils for an axial gradiometer that measures $\partial B_z/\partial z$ is shown in FIG. 4b. The two pickup loops are wound in opposition and balanced so that a uniform field $B_z$, such as the z-component of the earth's field, links zero net flux to the flux transformer. A gradient $\partial B_z/\partial z$, on the other hand, does induce a net flux and thus generates an output from the flux-locked SQUID. FIG. 4c shows the pickup and input coil for a second-order gradiometer that measures $\partial B_z/\partial z^2$.

The most important application of the gradiometer is in neuromagnetism, notably to detect weak magnetic signals emanating from the human brain, The gradiometer discriminates strongly against distant noise sources, which have a small gradient, in favor of locally generated signals, One can thus use a second-order gradiometer in an unshielded environment, although the present trend is towards using first-order gradiometers in a shielded room of aluminum and mumetal that greatly attenuates the ambient magnetic noise, In this application, axial gradiometers of the type shown in FIG. 4b actually sense the magnetic field, rather than the gradient, because the distance from the signal source to the pickup loop is less than the baseline of the gradiometer. The magnetic field sensitivity referred to the pickup loop is typically 10 fT $Hz^{-\frac{1}{2}}$. There are two basic types of measurements made on the human brain. The first detects spontaneous activity with a classic example being the generation of magnetic pulses by subjects suffering from focal epilepsy. The second type involves evoked response, for example, Romanie et al., 216 *Science* 1339 (1982), detected the magnetic signal from the auditory cortex generated by tones of different frequencies.

Conventional dc SQUIDs have been used for a number of years to measure extremely small values of voltage, magnetic flux, and magnetic flux gradients at low frequencies. Low $T_c$ superconductors, requiring liquid helium cooling, have been used to form the dc SQUID superconducting loop. The recent advent of high temperature superconducting materials, which allow operation at liquid nitrogen temperatures, has strengthened interest in the dc SQUID.

The most distinctive property of a superconductive material is its loss of electrical resistance when it is at or below a critical temperature. This critical temperature is an intrinsic property of the material and is referred to as the superconducting transition temperature of the material, $T_c$.

Research into the ability of specific materials to superconduct began with the discovery in 1911 that mercury superconducts at a $T_c$ of about 4° K. Since then, many applications for superconducting materials have been conceived, but such applications could not be commercialized because of the extremely low $T_c$ of the superconducting materials then available. Liquid helium, which is itself expensive, and the complicated refrigerant units required for liquid helium, were cost prohibitive to the use of such low $T_c$ superconductors in many applications.

Until about 1986 the highest temperature superconductor known was $Nb_3Ge$ having a critical temperature, $T_c$, of approximately 23.2° K. Before 1987, superconducting devices, even those which employed the $Nb_3Ge$ superconductor, required the use of liquid helium as the refrigerant-coolant.

In late 1986, Bednorz and Muller disclosed that certain mixed phase compositions of La-Ba-Cu-O appeared to exhibit superconductivity being at an onset temperature, $T_{co}$, of about 30° K. Bednorz et al, *Z. Phys. B., Condensed Matter*, vol. 64, pp. 189-198 (1986). The upper temperature limit of superconducting onset, $T_{co}$, of superconductors of a this type crystalline structure is no greater than about 38° K. Liquid helium was still required as the coolant for such a 214 type of material.

A new class of rare earth-alkaline earth-copper oxides was then discovered that are superconductive at temperatures above the boiling point of liquid nitrogen, 77° K. These new rare earth-alkaline earth-copper oxides are now commonly referred to as "123" high-temperature superconductors, in reference to the stoichiometry in which the rare earth, alkaline earth, and copper metal atoms are present, namely a ratio of 1:2:3.

With the discovery of the 123 class of "high temperature superconducting" (HTS) compounds—HTS compounds are those which superconduct at a $T_c$ above the temperature at which liquid nitrogen can be used as a refrigerant—it has become economically possible to pursue many previously conceived applications of the superconductivity phenomena which before were commercially impractical wherein cooling by liquid helium was required. Since they superconduct at temperatures greater than 77° K., the new 123 high temperature superconductors may in practical applications be cooled with liquid nitrogen—a more economically feasible refrigerant. Liquid nitrogen is about 2000 times more efficient to use in terms of cost, both of the refrigerant itself and the associated refrigerant unit design.

Detection of Magnetic Flux with Parallel Josephson Junction Arrays.

The sensitivity of the magnetometer is dependent on the flux-to-voltage transfer coefficient $V_{1\phi 1}$ of the active device, such as the dc SQUID. One way to increase $V_\Phi$ is to produce a device with sharper peaks in a plot of total critical current versus flux for the active device. A dramatic enhancement and sharpening of the peaks in critical current versus flux, resulting from quantum interference, was first predicted by Feynman et al., *The Feynman Lectures on Physics*, Vol. III, Chap. 21, pp. 21–18 (1965), for an array consisting of many Josephson junctions (JJs) in parallel, by analogy to the enhancement of the peaks in an optical slit diffraction pattern when a double slit is replaced by N slits or, equivalently, a diffraction grating. This enhancement was first observed experimentally in the mid- to late 1960s using superconducting point contact junctions. Zimmerman & Silver, 141 *Physics Review* 367 (1966); Waele, et al., 40 *Physics* 302 (1968). Three- and four-junction interferometers were developed for logic and switching applications in the 1970s. Stuehm & Wilmsen, 20 *Appl. Phys. Lett.* 456 (1972); Zappe, 27 *Appp. Phys. Lett.* 432 (1975). More recently, a parallel array of several (3–5) weak links near a control line has been successfully utilized in a high $T_c$ "superconducting flux flow transistor." Hohenwarter, et al., MAG-25 *IEEE Trans. Mag* 954 (1989); Martens, et al., 65 *J. Appl. Phys.* 4057 (1989). However, since the 1960s there has been virtually no art except for recent work by the inventors involving the use of parallel JJ arrays, or multi-junction interferometers, for the detection of magnetic flux, and no magnetometer or gradiometer incorporating a JJ array with many junctions in parallel has ever been built. Miller, et al., 59 *Appl. Phys. Lett.* 3322 (1991). One problem has been that the effects of nonuniformity of the junction critical currents are nonobvious.

Consider the N-loop interferometer, or Superconducting QUantum Interference Grating (SQUIG), illustrated in FIG. 5, in which N+1 junctions are in parallel. In FIG. 5, the Josephson junctions are represented by crosses, $\delta_i$ represents the phase difference between the "wavefunctions," or order parameters on opposite sides of each junction, and $\Phi_i$ represents the magnetic flux passing through each loop. In the low inductance limit, the flux $\Phi_i$ through each loop is equal to the externally applied flux per loop $\Phi$, but this is no longer the case when the loops have significant, finite self- and mutual-inductances. The total critical current as a function of applied flux $\Phi$ is therefore nonobvious for the case of finite inductance.

Practical SQUIGs often have significant nonuniformity of the junction critical currents, which must be taken into account in order to meaningfully assess the viability of SQUIGs for magnetic flux detection. For a ten-junction SQUIG with $\delta = 0.4$, with increasing values of the standard deviation $\sigma$, are shown in FIG. 6, which illustrates that randomizing the critical currents only slightly reduces the principal maxima in critical current versus flux. This result indicates that nonuniformity of the junction critical currents has a substantially less adverse impact than nonuniformity of the flux coupled into each loop, the latter of which could be minimized by utilizing a suitable geometry designed to minimize nonuniformity of the flux coupled from the input coil to the SQUIG loops.

There has been a long-felt need for a device which would be capable of more accurately measuring magnetic fluxes. More particularly, there has been a need for a device based on SQUID technology which would be able to detect and accurately measure small absolute fluxes or small flux changes.

SUMMARY OF THE INVENTION

A device according to the present invention is capable of accurately detecting and measuring small magnetic fluxes and magnetic flux differences. The device has an enhancement of flux-to-voltage transfer function, which is useful in a large number of applications and could, for example, result in deconvolving complex spatial dependence of the magnetic field. Furthermore, the performance of a device according to this invention is not seriously degraded by the non-uniformity of the critical current from junction to junction, provided the areas of the loops are substantially identical. In addition, a device according to this invention can be used with virtually any superconductor, including low $T_c$ and high $T_c$ materials. With recent advances in superconducting materials, it is now possible to use a high $T_c$ superconducting thin film N-junction interferometer in lieu of a dc SQUID in liquid nitrogen operations.

The device according to this invention generalizes the two-junction interferometer (dc SQUID) to N-junctions, where N is at least three, preferably at least four, more preferably at least five, yet more preferably at least six, and most preferably at least ten. In principle, improved performance would be obtained with increasing number of junctions, so that devices having hundreds or even thousands of junctions would be desirable. The configuration of the device of the present invention uses a number of Josephson junctions (or weak links) to form a parallel array of loops.

The sharpening effect on the voltage-flux characteristic is not significantly degraded when a reasonably finite number of junctions is used and when the non-uniformity of the junction critical currents is taken into account.

The parallel N-junction interferometer, or SQUIG, can be used with any suitable superconductor. In particular, the device of the present invention can be used with low $T_c$ superconductors. The device according to this invention can also be used with high $T_c$ superconductors. A SQUIG according to this invention is envisioned to have a radial geometry with a central hub and "spokes" containing the junctions radiating out from that hub. In an alternative embodiment such a SQUIG would have a central hub with spokes containing junctions radiating outward to a surrounding circular, semicircular, or polygonal conductor, with the central hub connected to a circuit using a cross-over conductor.

A further alternative embodiment of this invention envisions using separate input coils connected to separate pickup loops for each enclosed loop within the SQUIG. Further, these pickup loops can use an overlayed geometry or a fan out geometry.

A SQUIG according to the present invention can be used in a magnetometer, with an increased area of measurement over conventional SQUIDs. Additionally, first and second-order gradiometers can be developed using the SQUIG. Further, the SQUIG can be used as a magnetic field calibration standard, to measure the absolute magnetic field and to develop magnetic field images.

BRIEF DESCRIPTION OF THE DRAWINGS

The above and other embodiments of this invention may be more fully understood from the following detailed description when taken together with the accompanying drawing and in which.

DESCRIPTION OF THE PREFERRED EMBODIMENTS

Figure 6:
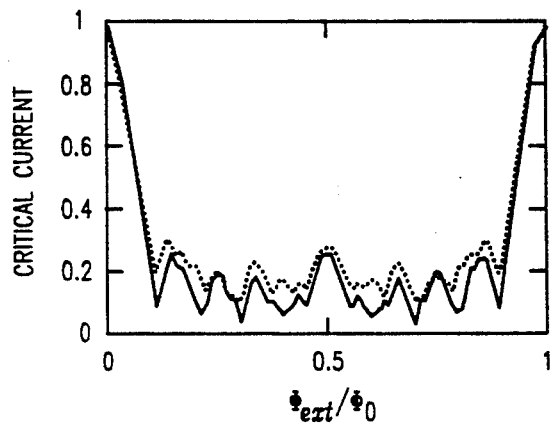
FIG. 6 shows the computed normalized total critical current versus flux for a ten-junction multi-junction interferometer with $\delta = 0.4$ and with Gaussin distributions of junction critical currents, where the standard deviations are $\delta = 0.0$ (solid line), $\delta = 0.1$ (dashed line), and $\delta = 0.5$ (dotted line).
Figure 7:
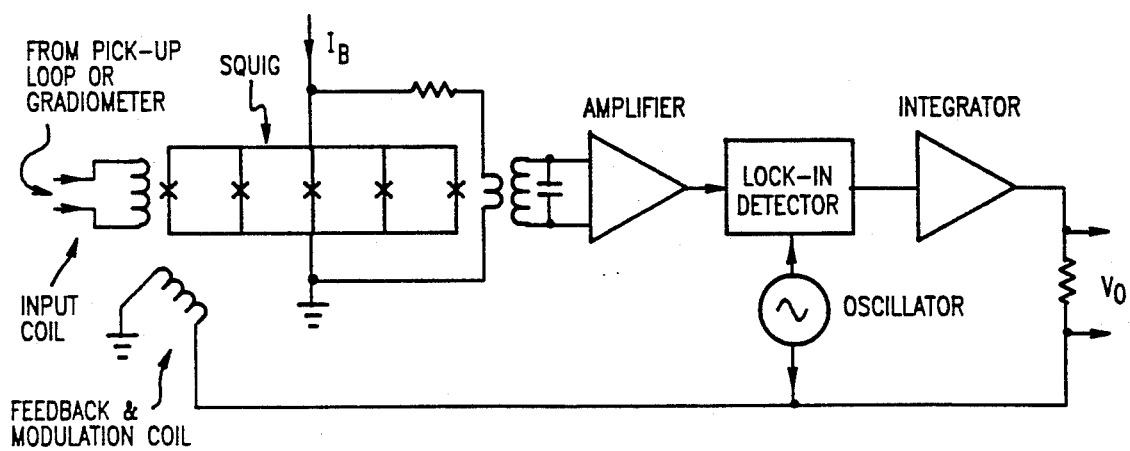
FIG. 7 is a schematic representation of a SQUIG used in a flux lock loop, lock-in detector circuit according to the invention, with inputs from a pickup loop or gradiometer coil.

Turning to the drawings, FIG. 7 shows a circuit to be used in a magnetometer or gradiometer according to this invention. This circuit is a standard flux lock loop circuit well known in the art as previously shown in FIG. 3, with the exception that rather than using a dc SQUID, this circuit uses a SQUIG. The input coil can be connected to a single loop to form a magnetometer, two opposed loops to form a first-order gradiometer, or even more complex loop configurations to form, for example, a second-order gradiometer. These loop configurations are well known in the art, and include those shown in FIG. 4. Because of the increased slope of the critical-current-to-flux characteristic, as shown in FIG. 6, such a magnetometer or gradiometer would be far more sensitive than those currently known in the art.

Figure 1A:
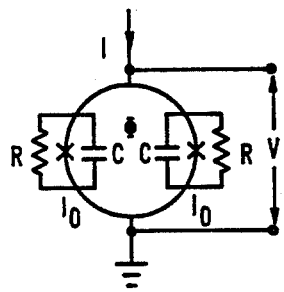
FIG. 1 shows (a) a schematic of a dc SQUID, (b) the current-voltage characteristic of that SQUID, and (c) the voltage-flux characteristic of that SQUID.
Figure 1B:
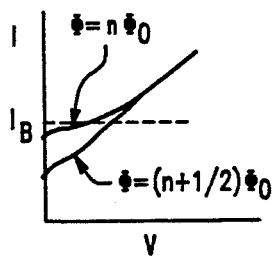
Figure 1C:
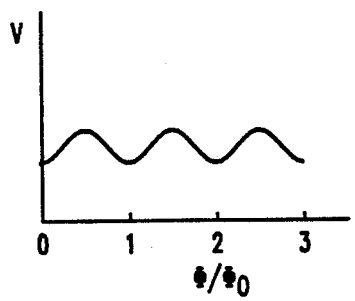
Figure 2A:
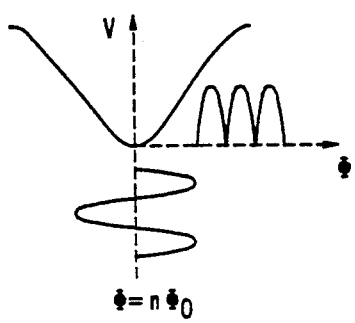
FIG. 2 shows the voltage-flux characteristics of a dc SQUID to which a modulating flux is applied, including (a) a plot of the voltage versus the flux where the flux is an integral multiple of one flux quantum, (b) a plot of the voltage versus the flux where the flux is an integral plus one-fourth times one flux quantum, and (c) a plot of a lock-in detector's output voltage versus the flux.
Figure 2B:
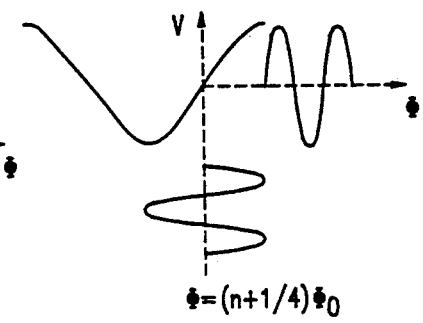
Figure 2C:
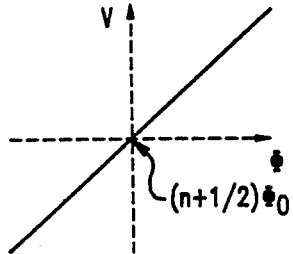
Figure 3:
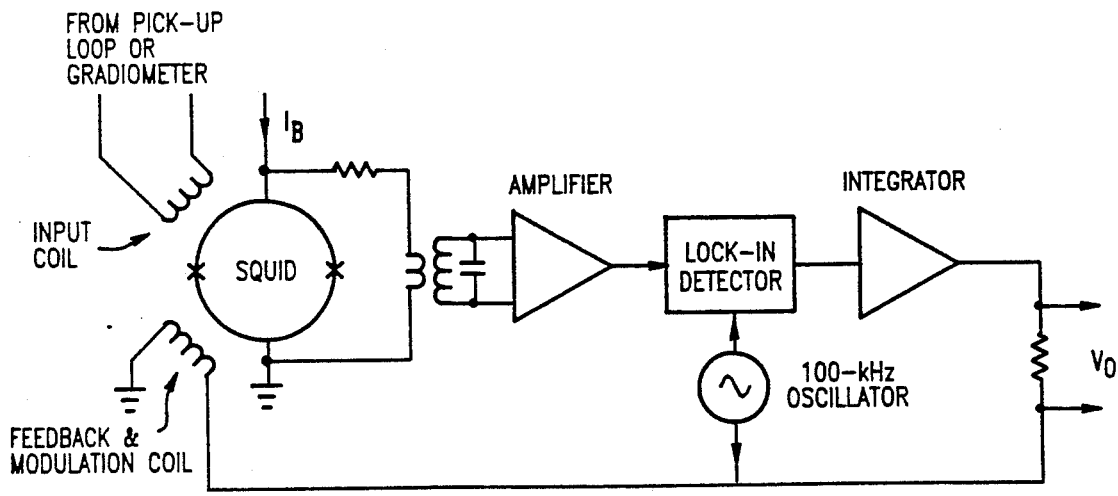
FIG. 3 shows a schematic of a circuit used to lock-in detect the magnetic field induced from a pickup loop or gradiometer coil.

As previously mentioned with respect to FIG. 3, the design, construction, and efficiency of the feedback and modulation coil are not critical. With a SQUIG, however, the feedback coil should be designed to make the field strength into each loop of the SQUIG as uniform as possible. This would be simple for one familiar with the art. The feedback coil could be a metal spiral that is fabricated on the same substrate as the SQUIG itself, or could simply be a wire solinoid; the exact design is not critical.

Figure 8:
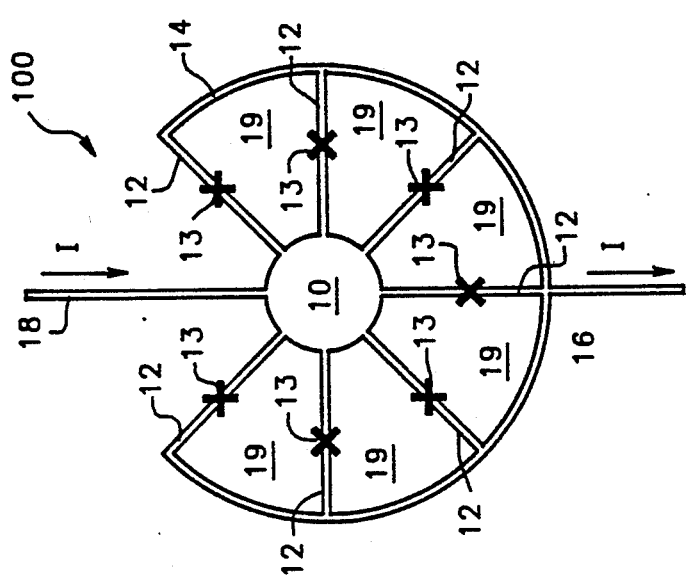
FIG. 8 is a representation of a physical embodiment of a SQUIG according to this invention.

FIG. 8 shows a semi-circular radial geometry SQUIG 100 configuration for use in the magnetometer or gradiometer of FIG. 7. This radial geometry should better achieve uniform coupling to the input coil from the pickup loop or gradiometer. The semi-circular radial geometry SQUIG is composed of a central hub 10 with conducting spokes 12 radiating away from the central hub 10. Spokes 12 contain Josephson junctions 13 such that one terminal of each Josephson junction 13 is electrically connected to the central hub 10, and the spokes 12 radiate outwards to a semi-circular conductor 14. The ground conductor 16 and the input conductor 18 respectively connect to the semi-circular conductor 14 and the central hub 10. The spokes 12, central hub 10, and semi-circular conductor 14 create loops 19. The ground conductor 16 and the input conductor 18 could of course be reversed, and instead correspondingly connect to the central hub 10 and the semi-circular conductor 14. The number of loops 19 is at least three, preferably at least four, more preferably at least five, yet more preferably at least six and most preferably at least ten. In principle, improved performance would be obtained with increasing number of junctions, so that devices could have hundreds or even thousands of junctions.

Figure 9:
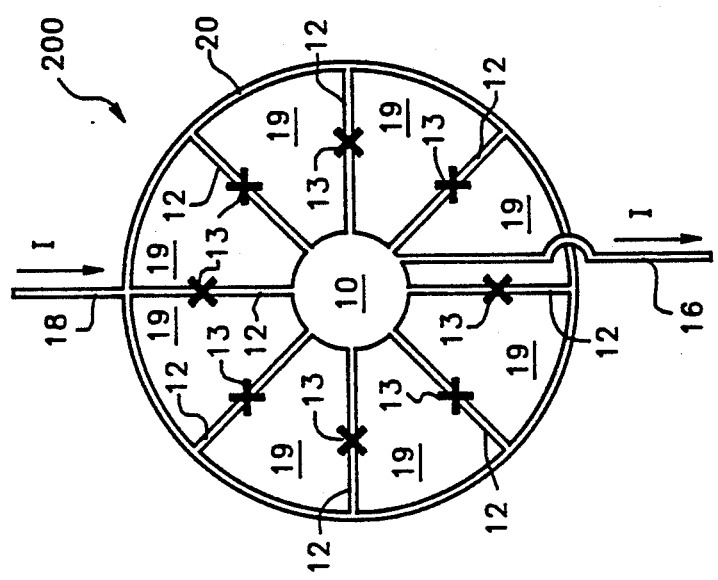
FIG. 9 is an alternative physical embodiment of the interferometer of FIG. 8, but featuring a cross-over for the input or output bias current electrical connection.

FIG. 9 shows an alternative embodiment of the SQUIG according to this invention, a circular radial geometry SQUIG 200. This embodiment corresponds to the semi-circular radial geometry SQUIG 100, but instead includes a circular conductor 20 to which the spokes 12 radiate from the central hub 10. Further, a cross-over ground conductor 22 connects to the central hub 10.

Figure 10:
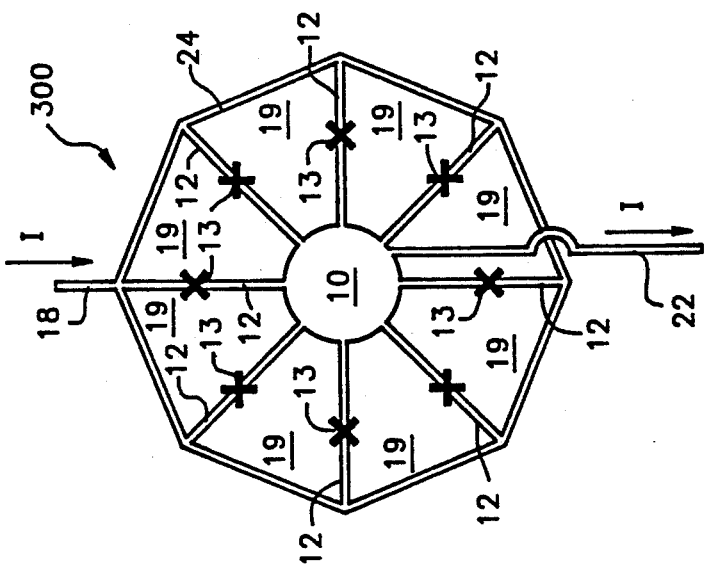
FIG. 10 is yet another alternative physical embodiment of the interferometer of FIG. 8, but featuring a polygonal conductor rather than a circular conductor.

FIG. 10 shows another alternative embodiment of the SQUIG according to this invention, a polygonal radial geometry SQUIG 300. This embodiment corresponds to the circular radial geometry SQUIG 200, but instead of a circular conductor 20, includes a polygonal conductor 24. Although in FIG. 10 the polygonal radial geometry SQUIG 300 is shown with the cross-over ground conductor 22, the polygonal radial geometry SQUIG 300 could of course be constructed as is the semi-circular radial geometry SQUIG 100. In such a case, the polygonal radial geometry SQUIG 300 would not have the cross-over conductor 22, but would instead simply be missing one "leg" of the polygonal conductor 24, similar to the SQUIG shown in FIG. 8.

In the SQUIGs of FIGS. 8, 9, and 10, the loops 19 have substantially equivalent areas, as variations in area will affect the performance of the SQUIG. Further, the exact shapes of the fully or partially encircling conductors are not critical. One skilled in the art would appreciate that the semi-circular conductor 14, the circular conductor 20, or the polygonal conductor 24 could assume other shapes, the only constraint being that each of the loops 19 remain essentially symmetrical to the other loops 19. Maintaining symmetry among the shapes and sizes of the loops 19 provides for better flex coupling into each of the loops 19.

Figure 4A:
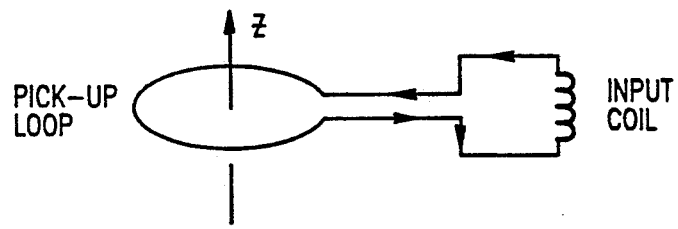
FIG. 4 shows various pickup loop configurations for use in a flux transformer, including configurations for a (a) magnetometer, (b) first-derivative gradiometer, and (c) second-derivative gradiometer.
Figure 11:
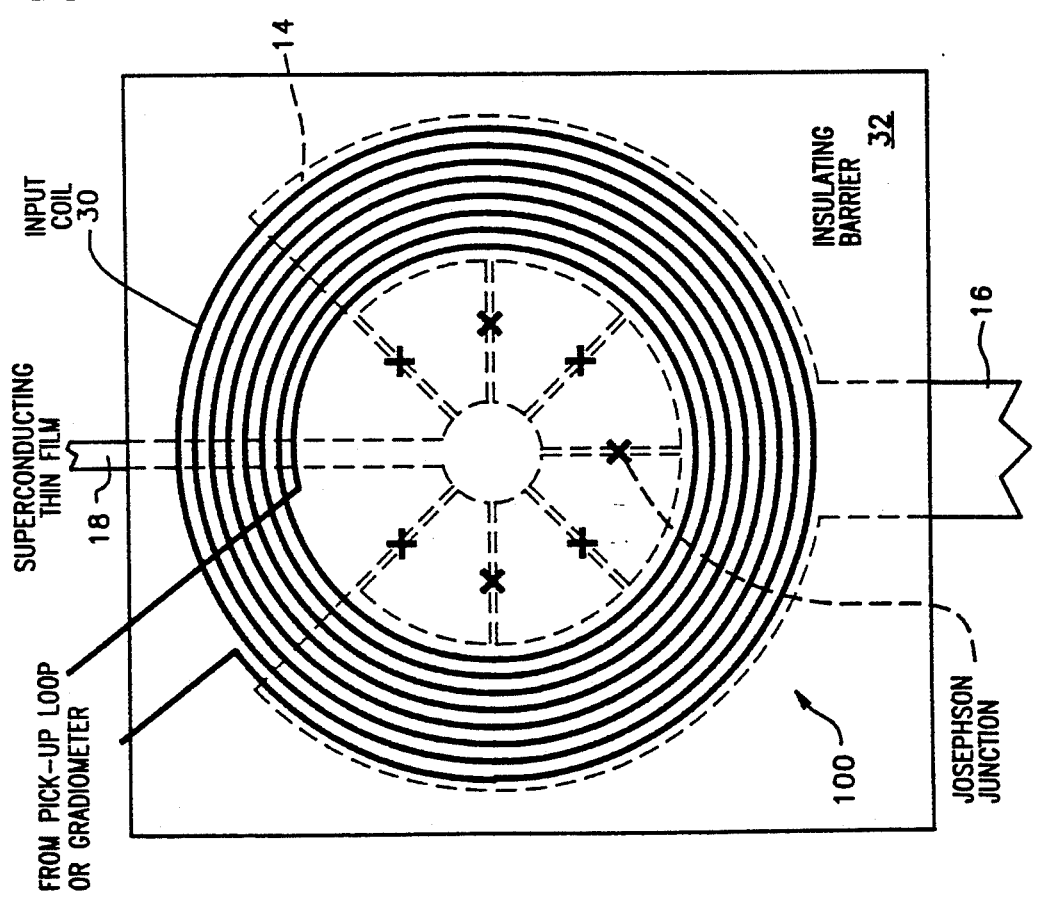
FIG. 11 shows the SQUIG of FIG. 8 as it would be configured with an input coil for use in a magnetometer or gradiometer.

FIG. 11 shows the semi-circular radial geometry SQUIG of FIG. 8 as it can be used in the magnetometer or gradiometer of FIG. 7. The semi-circular radial geometry SQUIG 100 of FIG. 8 is overlayed by an input coil 30. Further, an insulating barrier 32 prevents the input coil 30 from contacting the semi-circular radial geometry SQUIG 100. It is noted that the semi-circular conductor 14 is wide, preferably as wide as the input coil 30 to help focus all of the flux developed by the input coil 30 into the semi-circular radial geometry SQUIG 100. Further, while the SQUIG 100 itself must of course be superconducting, it is preferable that the input coil 30 also be superconducting. Of course, the input coil 30 can be connected to a variety of pickup loops as is shown in FIG. 4, and used in the circuit of FIG. 7 to create a variety of devices, including magnetometers. Of course, the circular radial geometry SQUIG 200 or the polygonal radial geometry SQUIG 300 can be used in place of the semi-circular radial geometry SQUIG 100 in the configuration of FIG. 11.

Figure 12:
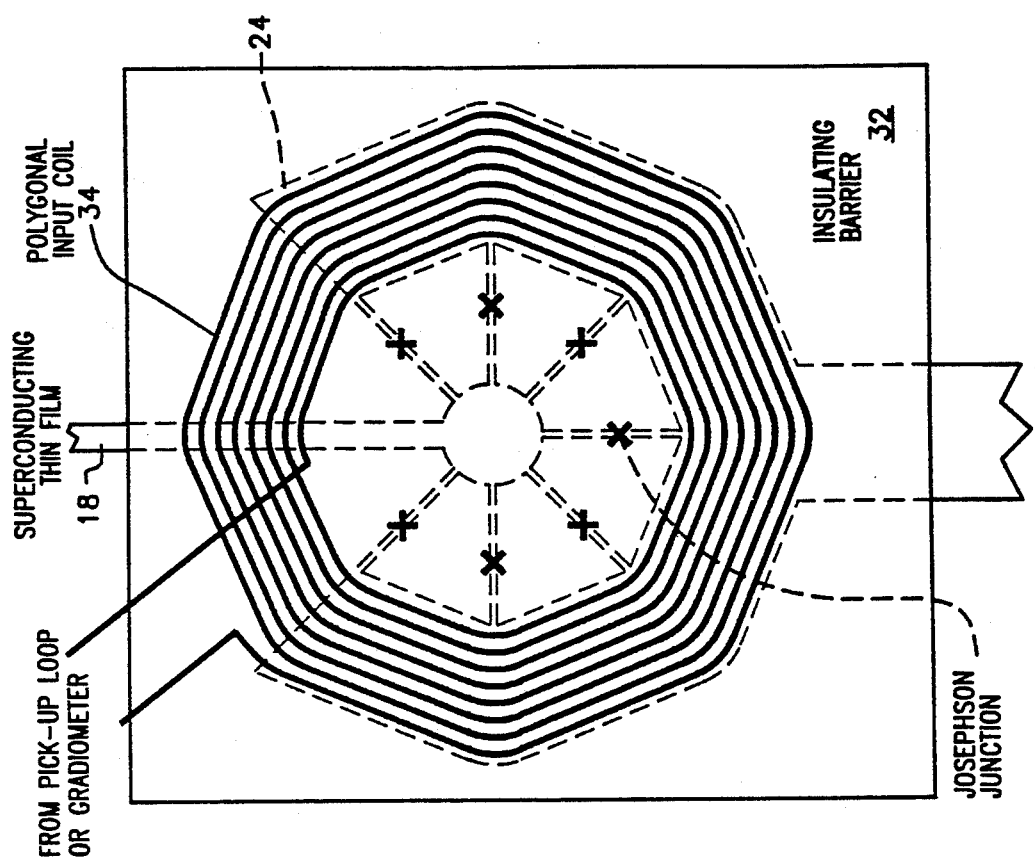
FIG. 12 shows an alternate embodiment of FIG. 11, showing how a polygonal SQUIG would be configured with an input coil for use in a magnetometer or gradiometer.

In FIG. 12, a radial SQUIG in which the encircling conductor is polygonally shaped is shown used with a polygonal input coil 34. As in FIG. 11, the SQUIG and polygonal input coil 34 of FIG. 12 can be used in the magnetometer or gradiometer of FIG. 7. One skilled in the art would readily ascertain that whatever the shape of the SQUIG, it is preferable that the input coil substantially follow the contours of the surrounding conductor. This provides for maximal flux coupling between the input coil and the loops of the SQUIG. But while it is preferable that the input coil substantially overlay the surrounding conductor, it is not essential, and the polygonally shaped SQUIG in FIG. 12 would, of course, work with a spiral-shaped input coil, and vice versa. The same, of course, holds true for the SQUIG and input coil of FIG. 11.

Figure 13:
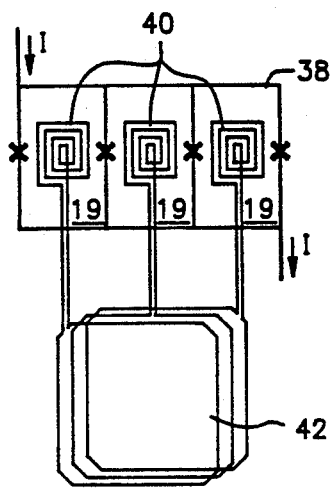
FIG. 13 shows an alternate embodiment of how input coils and pickup loops can be configured with a SQUIG according to this invention for use in a magnetometer or gradiometer.

FIG. 13 shows yet further alternative embodiments of a SQUIG for use in FIG. 7. FIG. 13 also shows a SQUIG 38 in which each loop 19 is flux linked to the external pickup loop via separate input coils 40. Each input coil 40 is separately connected to a pickup loop 42. These pickup loops 42 are overlayed and, when used in the circuit of FIG. 7, provide the function of a magnetometer.

Figure 4B:
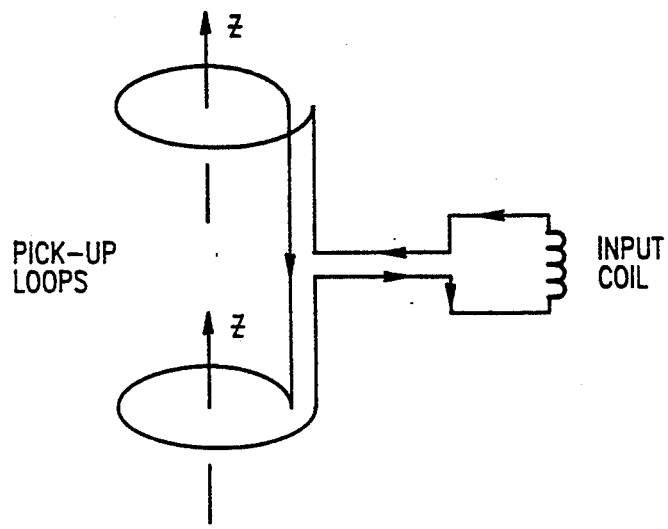
Figure 4C:
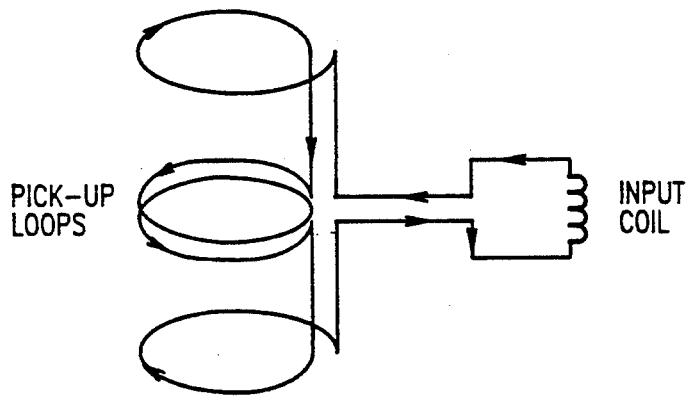
Figure 5:
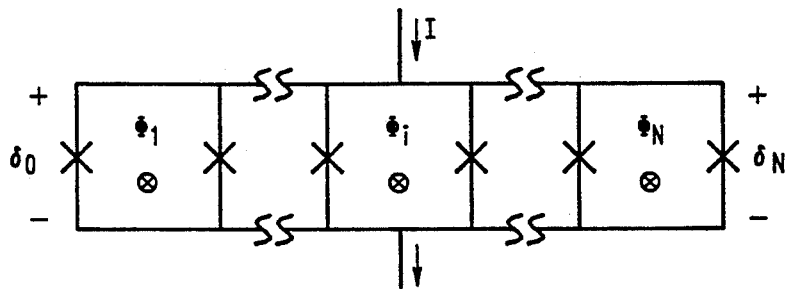
FIG. 5 shows a schematic representation of a parallel (N+1)-junction interferometer, or SQUIG.
Figure 14:
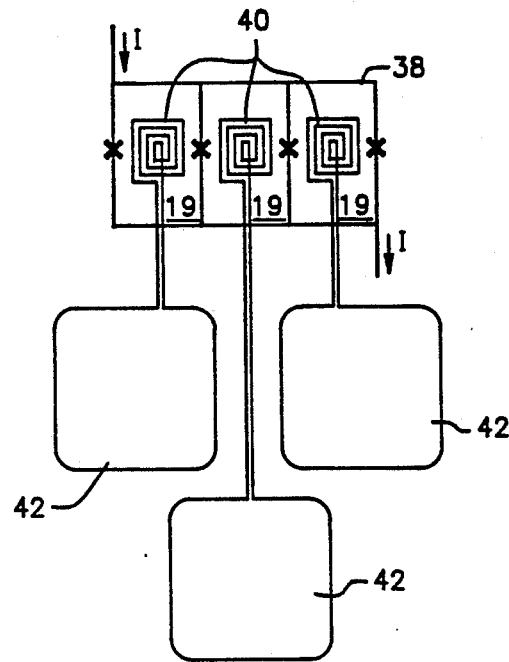
FIG. 14 shows a second alternate embodiment of how input coils and pickup loops can be configured with a SQUIG according to this invention for use in a magnetometer or gradiometer.

FIG. 14 shows an alternative embodiment to FIG. 13, in which the pickup loops 42 are arrayed not in an overlayed manner, but in a fanned out manner. Of course, the pickup loops 42 in FIGS. 13 and 14 can be substituted with a first or second order gradiometer as shown in FIGS. 4b and 4c.

Figure 15:
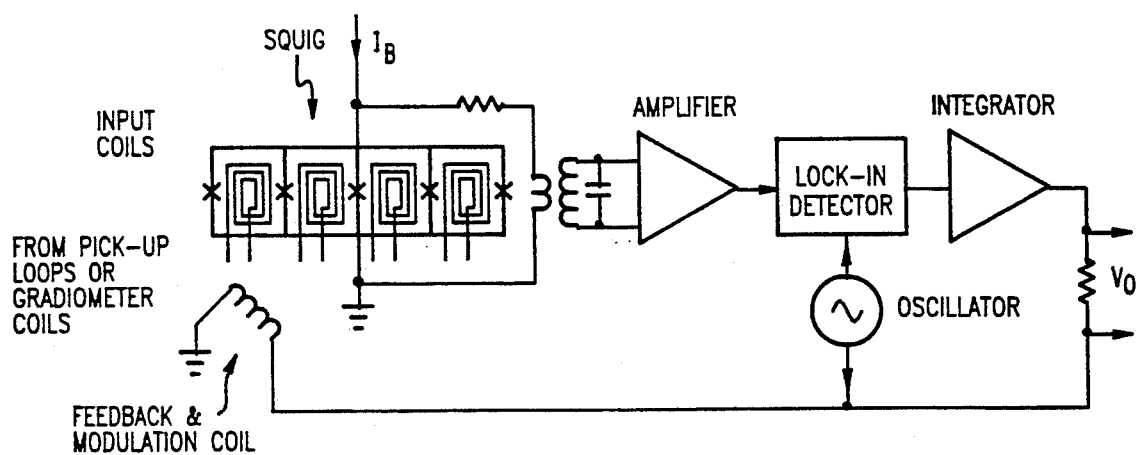
FIG. 15 is a schematic representation of a SQUIG used in a flux lock loop, lock-in detector circuit according to the invention, with multiple input coils from pickup loops or gradiometer coils.

FIG. 15 shows how the SQUIGs of FIGS. 13 and 14 can be used in a magnetometer or gradiometer circuit. This circuit is similar to FIG. 7, except for the multiple input coils. Again, the exact construction of the feedback coil is not critical; it should simply provide a field uniform over the body of the entire SQUIG and should be isolated from any pickup coils.

In addition, the device according to this invention could be used in at least three applications which cannot currently be implemented with conventional SQUID technology:

A. Magnetic field calibration standard. The unique and unexpected properties of the SQUIG allow one to design a system which precisely measures well-defined, quantized values of magnetic field, which are sufficiently widely spaced to be readily achievable in a typical laboratory. By contrast, conventional SQUID magnetometers are generally able to measure extremely small changes in magnetic flux. The primary feature distinguishing the present invention from conventional SQUID is that the width, $\delta\Phi \sim \Phi_0/N$, of the dip in its voltage-flux characteristic for a given bias current is much smaller than the spacing, or periodicity $\Phi_0$, whereas in a conventional SQUID the width, $\delta\Phi$, is comparable to the periodicity, $\Phi_0$.

B. Absolute magnetic field measurements. The properties of the SQUIG allow one to design a system wherein the well-defined, quantized values of magnetic field are more widely spaced than the largest field to be measured in a given environment. Thus, if operated in a feedback mode, the multi-SQUID could readily be utilized to precisely measure the absolute magnetic field as a function of space and time, a feature which would be very useful in geophysical and space applications. By contrast, conventional SQUID magnetometers generally measure extremely small changes in magnetic flux rather than the flux itself.

C. Magnetic field imaging. Numerical calculations demonstrate that when a non-uniform magnetic field is superimposed onto the externally applied uniform background field, the dips in the voltage-flux characteristic become broadened in a fashion which depends sensitively on the spatial form of the non-uniform field. This broadening is analogous to that which occurs in electron spin resonance (ESR) and nuclear magnetic resonance (NMR) in the presence of a non-uniform field. It is therefore anticipated that, by placing a parallel N-junction device in the vicinity of a non-uniform magnetic field, such as that produced by a magnetic tape or disk, an "image" or contour map showing the spatial dependence of the magnetic field can be created from the measured voltage-flux characteristics by using a suitable algorithm, perhaps analogous to the algorithms used in magnetic resonance imaging (MRI).

The construction of the SQUIGs shown in FIGS. 8-14 can of course be from normal superconducting materials or high $T_c$ superconducting materials. Further, a variety of means could be used to construct these devices, including conventional lithography. The manufacturer of such components would be well known to one skilled in the semiconductor art.

A major difficulty with conventional dc and rf SQUIDs is that the loop inductance, and consequently the area, must be low ($<100$ pH and $<10^{-8}$ m$^2$, respectively) for high temperature operation. A distinguishing feature of this invention is that the inductance per loop can be low while the total area can be large enough to couple into any associated flux transformer and modulation and feedback circuitry. Furthermore, the SQUIGs according to this invention can, in principle, be operated without a flux transformer, thereby simplifying the manufacturability with high $T_c$ superconducting thin films.

A requirement for using a SQUIG in the circuit of FIG. 7 is that the flux must be coupled efficiently and uniformly from the input coil into each loop of the SQUIG. The embodiments according to the invention shown in the figures can achieve such efficient, uniform coupling.

This concludes the description of preferred embodiments of this invention. Those skilled in the art may find many variations and adaptations of these embodiments, and all such variations and adaptations falling within the true scope of the spirit of this invention are intended to be covered by this description and the claims that follow.

What is claimed is:

1. A superconducting quantum interference grating capable of detecting magnetic flux, comprising:
    at least three Josephson junctions connected electrically in parallel, a first terminal of each of said junctions connected to a central hub, said junctions physically arrayed radially about said central hub.

2. The superconducting quantum interference grating of claim 1, wherein a second terminal of each of said Josephson junctions is electrically connected to a conductor.

3. The superconducting quantum interference grating of claim 1, wherein a second terminal of each of said Josephson junctions is electrically connected to a semicircular conductor.

4. The superconducting quantum interference grating of claim 1, wherein a second terminal of each of said Josephson junctions is electrically connected to a circular conductor.

5. The superconducting quantum interference grating of claim 1, wherein a second terminal of each of said Josephson junctions is electrically connected to a polygonal conductor.

6. A device for detecting magnetic fields, comprising:
    a superconducting quantum interference grating comprising at least three Josephson junctions connected electrically in parallel, a first terminal of each of said Josephson junctions connected to a central hub, said junctions physically arrayed radially about said central hub;
    an input coil for providing an externally supplied magnetic field to said superconducting quantum interference grating; and
    a lock-in detection circuit, wherein said circuit senses the voltage across said superconducting quantum interference grating and provides magnetic feedback to said superconducting quantum interference grating to maintain said superconducting quantum interference grating in a predetermined state, and wherein said circuit further provides an output indicating the amount of feedback being supplied to said superconducting quantum interference grating.

7. The device of claim 6, wherein said input coil is connected to a single pickup loop, whereby the device forms a magnetometer.

8. The device of claim 6, wherein said input coil is connected to a plurality of pickup loops, wherein the device forms a gradiometer.

9. The device of claim 6, wherein said input coil is a spiral coil overlaying said superconducting quantum interference grating such that said central hub is substantially centered within said spiral coil.

10. A device for detecting magnetic fields, comprising:
    a superconducting quantum interference grating;
    a plurality of input coils, each of said input coils substantially centered over a separate loop of said superconducting quantum interference grating; and
    a lock-in detection circuit, wherein said circuit senses the voltage across said superconducting quantum interference grating and provides magnetic feedback to said superconducting quantum interference grating to maintain said superconducting quantum interference grating in a predetermined state, and wherein said circuit further provides an output indicating the amount of feedback being supplied to said superconducting quantum interference grating.

11. The device of claim 10, wherein said input coils are connected to separate but substantially overlayed pickup loops.

12. The device of claim 10, wherein said input coils are connected to separate and substantially fanned out pickup loops.

* * * * *